US012665575B2

(12) United States Patent
Watanabe et al.

(10) Patent No.:  US 12,665,575 B2
(45) Date of Patent:      Jun. 23, 2026

(54) FILTER CIRCUIT

(71) Applicant: Mitsubishi Electric Corporation, Tokyo (JP)

(72) Inventors: Yosuke Watanabe, Tokyo (JP); Kyota Otsuka, Tokyo (JP); Kenji Hirose, Tokyo (JP); Akihito Kobayashi, Tokyo (JP); Yusuke Yamakaji, Tokyo (JP); Satoshi Yoneda, Tokyo (JP); Norihiko Akashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 57 days.

(21) Appl. No.: 18/982,137

(22) Filed: Dec. 16, 2024

(65) Prior Publication Data

US 2025/0119119 A1      Apr. 10, 2025

Related U.S. Application Data

(63) Continuation of application No. PCT/JP2022/027333, filed on Jul. 12, 2022.

(51) Int. Cl.
H01F 27/24 (2006.01)
H01F 27/28 (2006.01)
H03H 11/04 (2006.01)

(52) U.S. Cl.
CPC ............. H03H 11/04 (2013.01); H01F 27/24 (2013.01); H01F 27/2823 (2013.01)

(58) Field of Classification Search
CPC ...... H01F 27/24; H01F 27/2823; H03H 11/04
USPC ......................................................... 327/552
See application file for complete search history.

(56) References Cited

U.S. PATENT DOCUMENTS 6,984,979 B1 *  1/2006  Edel ..................... G01R 15/185
324/253
2013/0069741 A1   3/2013  Terakawa

FOREIGN PATENT DOCUMENTS

| JP | 61-151425 U | 9/1986 |
|---|---|---|
| JP | 8-78992 A | 3/1996 |
| JP | 2018-37942 A | 3/2018 |
| JP | 2019-149675 A | 9/2019 |
| WO | WO 2011/136232 A1 | 11/2011 |

OTHER PUBLICATIONS

International Search Report, issued in PCT/JP2022/027333, PCT/ISA/210, dated Oct. 11, 2022.

* cited by examiner

*Primary Examiner* — William Hernandez
(74) *Attorney, Agent, or Firm* — Birch, Stewart, Kolasch & Birch, LLP

(57) ABSTRACT

A filter circuit includes: a magnetic material core having a hollow hole through which a conductor line can be inserted; a wound wire wound around the magnetic material core through the hollow hole of the magnetic material core; and a variable impedance unit that is connected with the wound wire, and has impedance that is variable depending on a current or a voltage induced from the conductor line to the wound wire.

2 Claims, 4 Drawing Sheets

FILTER CIRCUIT

CROSS REFERENCE TO RELATED APPLICATION

This application is a Continuation of PCT International Application No. PCT/JP2022/027333, filed on Jul. 12, 2022, which is hereby expressly incorporated by reference into the present application.

TECHNICAL FIELD

The present disclosure relates to a filter circuit.

BACKGROUND ART

As for a measure against electromagnetic noise propagated through a cable (conductor line) connected to electrical equipment and electronic equipment, a measure is taken by attaching a filter circuit to the cable, and reducing propagation of electromagnetic noise, in some cases. As such a filter circuit, a tubular ferrite core that can be attached by retrofitting to a cable is often used. For example, by inserting a cable to the hollow portion of a tubular ferrite core, the magnetic field from the cable is intensified, and the self-inductance of the cable is raised to achieve high-frequency high impedance of the cable, thereby interrupting propagation of electromagnetic noise to the cable.

However, because an additional effect of a ferrite core, that is, impedance characteristics of the ferrite core, is uniquely determined by physical constants such as the length of the ferrite core, the ratio between the internal diameter and outer diameter of the tube, and material characteristics of the ferrite, there are only limited methods for obtaining certain impedance characteristics, and it has been difficult to cope with many types of cable.

In view of this, a configuration of a device having a structure for defining impedance characteristics not by physical constants of a ferrite core is disclosed in Patent Literature 1, for example. A noise attenuator according to Patent Literature 1 has a structure in which, around a tubular portion of the ferrite core attached to a cable which is a target for an anti-noise measure, a special wound wire is wound to be attached in such a way that the special wound wire penetrates the hollow portion of the tubular portion, and a resistor part is attached in series at in the way of the wound wire. Note that, it is said that the resistor part may be formed of a variable resistor. With a configuration like this, for an electronic device in an environment with disturbance of electromagnetic noise, it is possible to select an optimum resistance value that can reduce and remove the noise disturbance, and that can improve an electromagnetic environment at the installation site of the electronic device.

CITATION LIST

Patent Literature

Patent Literature 1: WO 2011/136232

SUMMARY OF INVENTION

Technical Problem

In a case where the optimum resistance value for reducing and removing the noise disturbance is selected for the noise attenuator depicted in Patent Literature 1, the resistance value is often higher than the characteristics impedance of a cable. Accordingly, impedance mismatch in signal transfer can occur at a portion of the cable where the ferrite core is attached. There has been a problem that, at this time, if a transmission signal such as a digital communication signal or a clock signal with a periodic square wave is transmitted using the cable, waveform distortion or ringing of the transmission signal occurs, and the signal transmission quality deteriorates undesirably.

An object of the present disclosure is to provide a filter circuit that makes it possible to achieve both reduction of propagation of electromagnetic noise through a cable, and reduction of deterioration of signal transmission quality.

Solution to Problem

A filter circuit according to the present disclosure includes: a magnetic material core having a hollow hole through which a conductor line is capable of being inserted; a wound wire wound around the magnetic material core through the hollow hole of the magnetic material core; and a variable impedance circuit that is connected with the wound wire, and has impedance that is variable depending on a current or a voltage induced from the conductor line to the wound wire, in which the variable impedance circuit includes: an element having characteristics in which impedance of the element is variable adaptively depending on the current or the voltage induced from the conductor line to the wound wire; a conductor wire that connects the element and both ends of the wound wire; and a resistor connected to the conductor wire, and the impedance of the variable impedance circuit changes depending on at least one of a type of the element, a number of windings of the wound wire, a type of the wound wire, a type of the conductor wire, and a constant of the resistor, and in which the element is a junction field-effect transistor, the wound wire includes a first wound wire, a first end of the first wound wire is connected to a drain terminal of the junction field-effect transistor, a second end of the first wound wire is connected to a source terminal of the junction field-effect transistor, and the impedance of the variable impedance circuit is equivalent to a ratio between a drain-source voltage of the junction field-effect transistor that is generated when a current or a voltage is induced from the conductor line to the first wound wire, and a drain-source current of the junction field-effect transistor that flows when the current or the voltage is induced from the conductor line to the first wound wire.

Advantageous Effects of Invention

By being configured in the manner described above, the present disclosure makes it possible to achieve both reduction of propagation of electromagnetic noise through a cable, and reduction of deterioration of signal transmission quality.

DESCRIPTION OF EMBODIMENTS

Hereinbelow, an embodiment is explained in detail with reference to the figures.

First Embodiment

Figure 1:
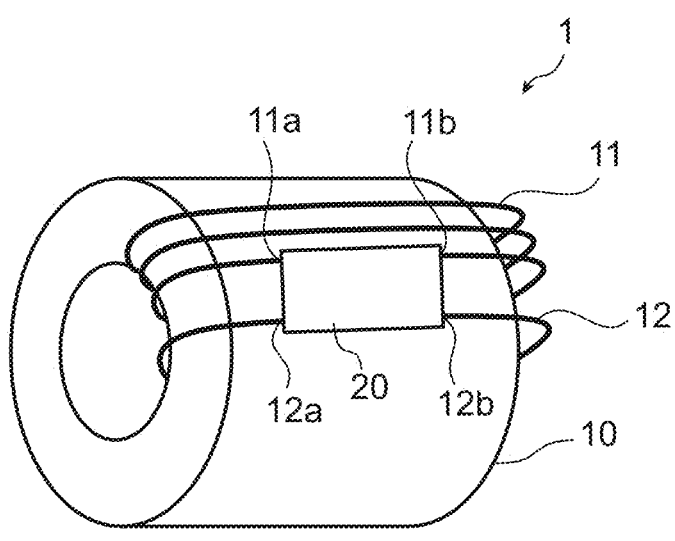
FIG. 1 is a figure depicting a configuration example of a filter circuit according to a first embodiment.

FIG. 1 is a figure depicting a configuration example of a filter circuit 1 according to a first embodiment. As depicted in FIG. 1, the filter circuit 1 according to the first embodiment includes a magnetic material core 10, a first wound wire 11, a second wound wire 12, and a variable impedance unit 20.

As depicted in FIG. 1, the magnetic material core 10 is formed tubularly. In addition, a hollow hole is formed through the magnetic material core 10. The first wound wire 11 and the second wound wire 12, and a cable (not depicted) which is a conductor line which is a target for an anti-noise measure can be inserted through the hollow hole.

The first wound wire 11 and the second wound wire 12 are wound around the magnetic material core 10 through the hollow hole formed through the magnetic material core 10. In addition, both ends (ends 11a and 11b) of the first wound wire 11, and both ends (ends 12a and 12b) of the second wound wire 12 are each connected to the variable impedance unit 20.

The variable impedance unit 20 is connected with both ends (the ends 11a and 11b) of the first wound wire 11, and both ends (the ends 12a and 12b) of the second wound wire 12. The variable impedance unit 20 is configured in such a manner that the impedance of the variable impedance unit 20 is variable depending on a current or a voltage induced from the cable to the first wound wire 11 and the second wound wire 12 when a transmission signal such as a digital communication signal or a clock signal with a periodic square wave is transmitted through the cable.

Figure 2:
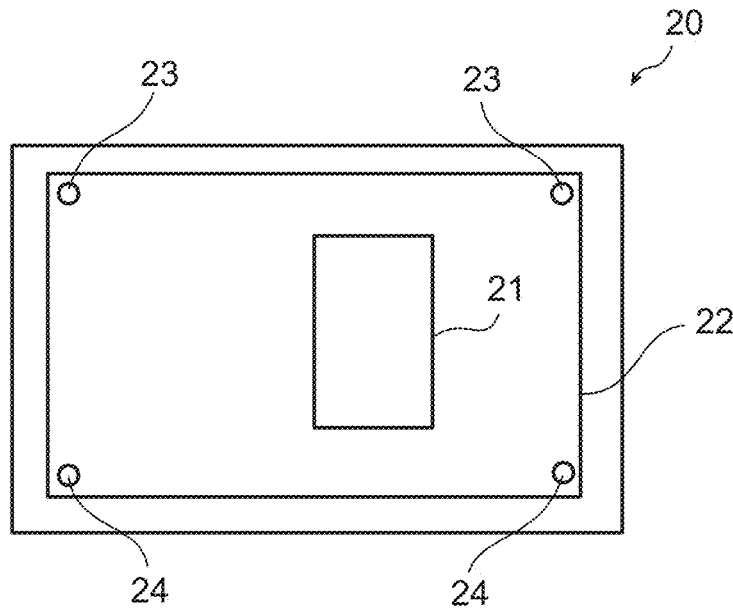
FIG. 2 is a figure depicting a configuration example of a variable impedance unit in the first embodiment.

FIG. 2 is a figure depicting a configuration example of the variable impedance unit 20 in the first embodiment. As depicted in FIG. 2, the variable impedance unit 20 includes an element 21, a peripheral circuit 22, wound-wire connection terminals 23, and wound-wire connection terminals 24.

The element 21 has characteristics in which the impedance of the element 21 is variable adaptively depending on a current or a voltage induced from the cable to the first wound wire 11 and the second wound wire 12 when a transmission signal such as a digital communication signal or a clock signal with a periodic square wave is transmitted through the cable. For example, the element 21 is a junction field-effect transistor (Junction field-effect transistor: JFET) which is one type of field-effect transistor.

The peripheral circuit 22 is a circuit for electrically connecting the element 21, and the wound-wire connection terminals 23 and the wound-wire connection terminals 24. For example, the peripheral circuit 22 includes a resistor 25 and a conductor wire 26 (see FIG. 3).

The wound-wire connection terminals 23 are terminals connected with the ends 11a and 11b of the first wound wire 11. As depicted in FIG. 2, for example, two wound-wire connection terminals 23 are provided at corners of the peripheral circuit 22.

The wound-wire connection terminals 24 are terminals connected with the ends 12a and 12b of the second wound wire 12. As depicted in FIG. 2, for example, two wound-wire connection terminals 24 are provided at locations which are at corners of the peripheral circuit 22, but are different from the locations where the wound-wire connection terminals 23 are provided.

Note that it is sufficient if the number of wound-wire connection terminals provided to the peripheral circuit 22 corresponds to the number of wound wires. For example, since two wound wires are used in the first embodiment, the number of provided wound-wire connection terminals also is four in total.

Figure 3:
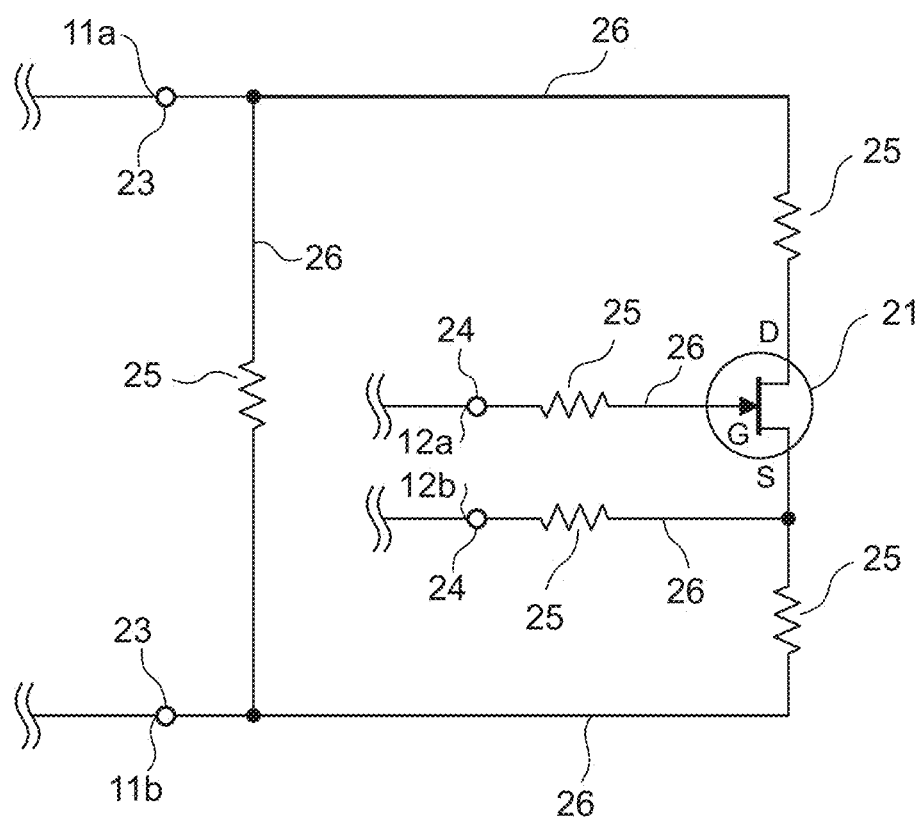
FIG. 3 is a figure depicting electrical connection of the filter circuit according to the first embodiment.

Next, electrical connection of the filter circuit 1 according to the first embodiment is explained. FIG. 3 is a figure depicting electrical connection of the filter circuit 1 according to the first embodiment. In an exemplary case explained here, the two wound wires (the first wound wire 11 and the second wound wire 12) are used, and an N-channel-type junction field-effect transistor is used as the element 21 of the variable impedance unit 20.

The two wound-wire connection terminals 23 are connected with the ends 11a and 11b of the first wound wire 11.

In addition, a first one of the two wound-wire connection terminals 23 (e.g. one connected with the end 11a of the first wound wire 11) is connected to a drain terminal of the junction field-effect transistor 21 via the conductor wire 26 and the resistor 25. In addition, a second one of the two wound-wire connection terminals 23 (e.g. one connected with the end 11b of the first wound wire 11) is connected to a source terminal of the junction field-effect transistor 21 via the conductor wire 26 and the resistor 25.

In addition, the two wound-wire connection terminals 23, that is, the drain terminal and the source terminal of the junction field-effect transistor 21, also are connected with each other via the conductor wire 26 and the resistor 25. Thereby, an electric potential difference that is generated in the first wound wire 11 is applied between the drain terminal and the source terminal of the junction field-effect transistor 21 as a voltage. Hereinbelow, this voltage is also referred to as a "drain-source voltage."

The two wound-wire connection terminals 24 are connected with the ends 12a and 12b of the second wound wire 12.

A first one of the two wound-wire connection terminals 24 (e.g. one connected with the end 12a of the second wound wire 12) is connected to a gate terminal of the junction field-effect transistor 21 via the conductor wire 26 and the resistor 25. In addition, a second one of the two wound-wire connection terminals 24 (e.g. one connected with the end 12b of the second wound wire 12) is connected with the source terminal of the junction field-effect transistor 21, and the second one of the two wound-wire connection terminals 23 via the conductor wire 26 and the resistor 25. Thereby, an electric potential difference generated in the second wound wire 12 is applied between the gate terminal and the source terminal of the junction field-effect transistor 21 as a voltage. Hereinbelow, this voltage is also referred to as a "gate-source voltage."

Next, an operation example and advantageous effects of the filter circuit 1 according to the first embodiment are explained.

First, a user attaches the filter circuit 1 to the cable which is a target for an anti-noise measure. Specifically, the user inserts the cable to the hollow hole of the magnetic material core 10 mentioned above. Note that the cable is given in advance a role of transmitting a transmission signal such as a digital communication signal or a clock signal with a periodic square wave, and not only electromagnetic noise, but also the transmission signal is transmitted through the cable.

Here, as a voltage or a current related to the electromagnetic noise or the transmission signal increases, the magnetic field generated from the cable is intensified at the magnetic material core 10. Thereby, not only an electric potential difference based on the number of windings of the first wound wire 11 is generated in the first wound wire 11 wound around the magnetic material core 10, but also an electric potential difference based on the number of windings of the second wound wire 12 is generated in the second wound wire 12. Because of this, the drain-source voltage and the gate-source voltage are applied to the junction field-effect transistor 21.

Figure 4:
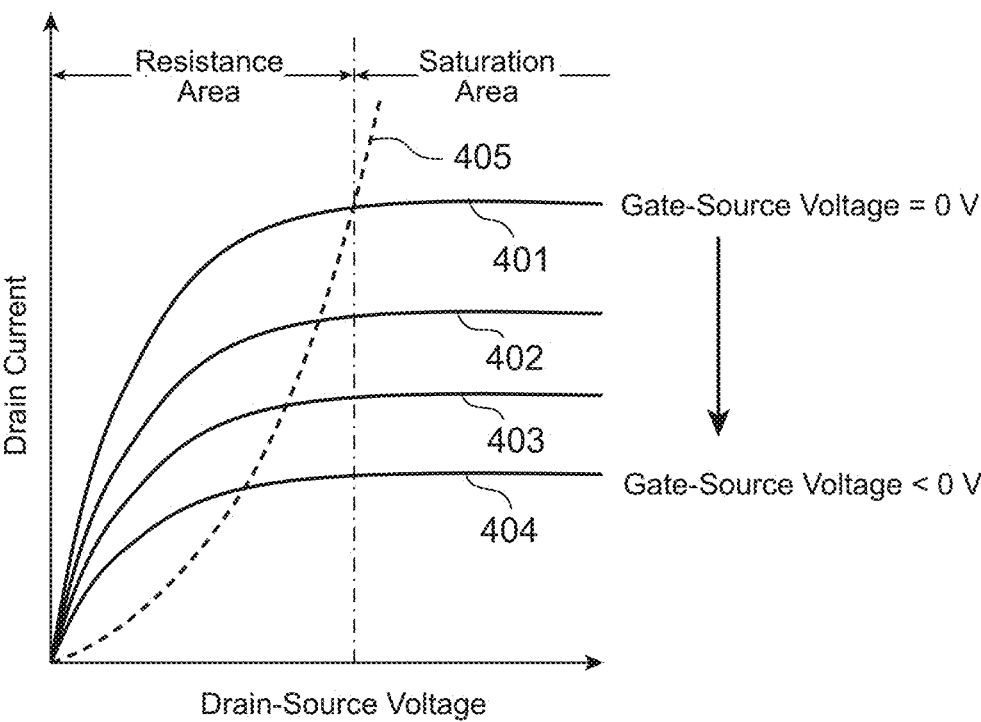
FIG. 4 is a figure depicting electrical characteristics of a junction field-effect transistor in the first embodiment.

Here, electrical characteristics of the junction field-effect transistor 21 in the first embodiment are depicted in FIG. 4. Note that FIG. 4 depicts electrical characteristics of a typical N-channel-type junction field-effect transistor. In FIG. 4, the horizontal axis represents the drain-source voltage applied to the junction field-effect transistor 21, and the vertical axis represents a current that flows between the drain terminal and the source terminal of the junction field-effect transistor 21 (hereinafter, also referred to as a "drain current" simply).

As depicted in FIG. 4, the drain current based on the applied drain-source voltage flows in the junction field-effect transistor 21 in the first embodiment. For example, in the junction field-effect transistor 21, as the applied drain-source voltage is increased from 0V, the drain current also increases. However, after the applied drain-source voltage enters the area on the right side of a dash-dotted line depicted in FIG. 4, the drain current no longer increases even though the drain-source voltage is increased. Note that, the area on the left side of the dash-dotted line in FIG. 4 is called a resistance area, and the area on the right side of the dash-dotted line in FIG. 4 is called a saturation area.

Here, in the junction field-effect transistor 21, the value of the drain current can be changed depending on the value of the applied drain-source voltage if the drain-source voltage is in the resistance area on the left side of the dash-dotted line. That is, in the junction field-effect transistor 21, if the ratio between the value of the applied drain-source voltage and the value of the drain current is considered as a resistance between the drain terminal and the source terminal (hereinafter, also referred to as a "drain-source resistance"), it becomes possible to change the value of the drain-source resistance within the range of the resistance area by changing the applied drain-source voltage.

In addition, as depicted in FIG. 4, the characteristics curve of the drain current can be changed also by the value of the gate-source voltage applied to the junction field-effect transistor 21.

For example, the characteristics curve of the drain current is a locus denoted with a reference sign 401 if the gate-source voltage applied to the junction field-effect transistor 21 is 0 V, and changes to loci denoted with reference signs 402, 403, and 404 as the gate-source voltage decreases from 0 V. That is, in the first embodiment, it becomes possible to change the ratio between the value of the drain-source voltage and the value of the drain current, that is, the value of the drain-source resistance, within the range of the resistance area, also by changing the value of the gate-source voltage applied to the junction field-effect transistor 21. Note that a reference sign 405 depicted in FIG. 4 denotes the value of the drain-source resistance when the characteristics curve of the drain current is a locus denoted with the reference sign 404.

In addition, for example, the electrical characteristics of the junction field-effect transistor 21 depicted in FIG. 4 can be adjusted by changing at least one of the type of the junction field-effect transistor 21 used, the numbers of windings of the first wound wire 11 and the second wound wire 12, the types of the first wound wire 11 and the second wound wire 12, the type of the conductor wire 26 included in the peripheral circuit 22, and the constant of the resistor 25 included in the peripheral circuit 22 (hereinafter, these are also referred to as "characteristics-adjusting factors.") In addition, for example, the range of changes that are made when the value of the drain-source resistance is changed as described above can be designed as appropriate by making the adjustment described above depending on the purpose of use of the filter circuit 1.

Therefore, in the filter circuit 1 according to the first embodiment, by using functions of this, the value of the drain-source resistance of the junction field-effect transistor 21 can be changed depending on a voltage induced to the first wound wire 11 and the second wound wire 12 at the timing when a voltage or a current related to a transmission signal or electromagnetic noise flowing through the cable has increased or decreased. Thereby, in the filter circuit 1 according to the first embodiment, in a case where the voltage or the current related to the transmission signal and the electromagnetic noise described above increases or decreases, the value of resistance between the two wound-wire connection terminals 23 in the variable impedance unit 20 can be changed.

For example, a user adjusts in advance the characteristics-adjusting factors mentioned above in such a manner that the drain-source resistance of the junction field-effect transistor 21 decreases as much as possible in a case where the voltage or the current related to the transmission signal flowing through the cable has increased, or in a case where the voltage or the current related to the electromagnetic noise flowing through the cable has decreased. On the other hand, for example, the user adjusts in advance the characteristics-adjusting factors mentioned above in such a manner that the drain-source resistance of the junction field-effect transistor 21 increases as much as possible in a case where the voltage or the current related to the transmission signal flowing through the cable has decreased, or in a case where the voltage or the current related to the electromagnetic noise flowing through the cable has increased.

Thereby, in the filter circuit 1 according to the first embodiment, occurrence of waveform distortion or ringing of the transmission signal can be reduced, since the drain-source resistance of the junction field-effect transistor 21 decreases, and the impedance of the cable electromagnetically coupled by the magnetic material core 10 lowers in a case where the voltage or the current related to the transmission signal flowing through the cable has increased, or in a case where the voltage or the current related to the electromagnetic noise flowing through the cable has decreased.

In addition, in the filter circuit 1 according to the first embodiment, in addition to the advantageous effects described above, propagation, through the cable, of electromagnetic noise at a level (intensity) lower than the level of the transmission signal can be reduced, since the drain-source resistance of the junction field-effect transistor 21 increases, and the impedance of the cable electromagnetically coupled by the magnetic material core 10 rises in a case where the voltage or the current related to the transmission signal flowing through the cable has decreased, or in a case where the voltage or the current related to the electromagnetic noise flowing through the cable has increased.

Accordingly, in the first embodiment, by attaching the thus-configured filter circuit 1 to a cable through which a transmission signal such as a digital communication signal or a clock signal flows, not only reduction of occurrence of waveform distortion or ringing of the transmission signal, but also reduction of propagation of electromagnetic noise through the cable is possible. As a result, in the first embodiment, it is possible to enhance the propagation reduction effect of the electromagnetic noise in a system in which the cable to which the filter circuit 1 is attached is used, and also to enhance the transmission quality of the transmission signal in the system.

Note that the wound-wire connection terminals 23 and 24 are provided at the corners of the peripheral circuit 22 in the example explained in the explanation described above. However, locations where the wound-wire connection terminals 23 and 24 are provided are not limited to the corners of the peripheral circuit 22. For example, the wound-wire connection terminals 23 and 24 may be provided at any locations of the peripheral circuit 22 depending on the manner of winding of the first wound wire 11 and the second wound wire 12 around the magnetic material core 10, or the like.

In addition, the filter circuit 1 includes two wound wires (the first wound wire 11 and the second wound wire 12) in the example explained in the explanation described above. However, the filter circuit 1 is not limited to such a case, but may include three or more wound wires. In that case, it is sufficient if the number of wound-wire connection terminals included in the peripheral circuit 22 corresponds to the number of the wound wires.

For example, in a case where the filter circuit 1 includes a third wound wire in addition to the first wound wire 11 and the second wound wire 12 described above, the peripheral circuit 22 includes six wound-wire connection terminals in total. In addition, each of the six wound-wire connection terminals is connected to any of the drain terminal, the gate terminal, and the source terminal of the junction field-effect transistor 21 via the conductor wire 26 and the resistor 25 as described above. Thereby, in the first embodiment, it is possible to adjust the magnitudes of the drain-source voltage and the gate-source voltage applied to the junction field-effect transistor 21; as a result, it is possible to adjust the value of the drain-source resistance.

In addition, the element 21 of the variable impedance unit 20 includes an N-channel-type junction field-effect transistor in the example explained in the explanation described above. However, the element 21 of the variable impedance unit 20 does not necessarily include an N-channel-type junction field-effect transistor, but, for example, may include a P-channel-type junction field-effect transistor. In that case, the drain current in the electrical characteristics depicted in FIG. 4 decreases as the gate-source voltage applied to the element 21 is increased from 0 V. That is, the characteristics curve of the drain current in the electrical characteristics depicted in FIG. 4 changes to the loci denoted with the reference signs 402, 403, and 404 as the gate-source voltage applied to the element 21 is increased from 0 V.

In addition, the element 21 of the variable impedance unit 20 includes a junction field-effect transistor in the example explained in the explanation described above. However, the element 21 of the variable impedance unit 20 does not necessarily include a junction field-effect transistor, but, for example, may include a bipolar transistor (Bipolar transistor), a metal-oxide-semiconductor field-effect transistor (Metal-oxide-semiconductor field-effect transistor: MOSFET), or an insulated gate transistor (Insulated gate bipolar transistor: IGBT).

In addition, the element 21 of the variable impedance unit 20 includes an N-channel-type junction field-effect transistor, and the filter circuit 1 includes two wound wires (the first wound wire 11 and the second wound wire 12) in the example explained in the explanation described above. However, in a case where the element 21 of the variable impedance unit 20 includes an N-channel-type or P-channel-type junction field-effect transistor, the second wound wire 12 may be omitted from the filter circuit 1, but the filter circuit 1 may include one wound wire (the first wound wire 11).

Because the gate-source voltage is not applied to the element 21 (junction field-effect transistor) in that case, it is sufficient if a user changes the value of the drain-source resistance in accordance with the characteristics curve of the drain current denoted with the reference sign 401 in FIG. 4.

For example, it is sufficient if a user adjusts in advance the characteristics-adjusting factors mentioned above excluding factors related to the second wound wire 12 in such a manner that the drain-source resistance of the junction field-effect transistor 21 decreases as much as possible in a case where a voltage or a current related to a transmission signal flowing through the cable has increased, or in a case where a voltage or a current related to electromagnetic noise flowing through the cable has decreased. On the other hand, for example, it is sufficient if the user adjusts in advance the characteristics-adjusting factors mentioned above excluding the factors related to the second wound wire 12 in such a manner that the drain-source resistance of the junction field-effect transistor 21 increases as much as possible in a case where the voltage or the current related to the transmission signal flowing through the cable has decreased, or in a case where the voltage or the current related to the electromagnetic noise flowing through the cable has increased.

Note that, in this case also, as explained above, it is suitable if the filter circuit 1 includes two wound wires (the first wound wire 11 and the second wound wire 12), and the gate-source voltage is applied to the element 21 since this allows the user to more flexibly change the value of the drain-source resistance.

On the other hand, in a case where the element 21 of the variable impedance unit 20 includes an element other than a junction field-effect transistor (e.g. in a case where application of the gate-source voltage or the gate-source current to the element 21 is necessary for operation of the element 21), it is sufficient if the filter circuit 1 includes two wound wires (the first wound wire 11 and the second wound wire 12). In that case, it is sufficient if the magnitude of the drain current flowing to the element 21 is controlled by controlling the magnitude of a current or a voltage applied between the gate and source of the element 21 using a current or a voltage induced to the second wound wire 12.

As mentioned above, according to the first embodiment, the filter circuit 1 includes: the magnetic material core 10 having a hollow hole through which a conductor line can be inserted; the wound wires 11 and 12 wound around the magnetic material core 10 through the hollow hole of the magnetic material core 10; and the variable impedance unit 20 that is connected with the wound wires 11 and 12, and has impedance that is variable depending on a current or a voltage induced from the conductor line to the wound wires. Thereby, the filter circuit 1 according to the first embodiment makes it possible to achieve both reduction of propagation of electromagnetic noise through a cable, and reduction of deterioration of signal transmission quality.

In addition, the variable impedance unit 20 includes: the element 21 having characteristics in which the impedance of the element 21 is variable adaptively depending on the current or the voltage induced from the conductor line to the wound wires 11 and 12; the conductor wire 26 that connects the element 21 and both ends of the wound wires 11 and 12;

and the resistor 25 connected to the conductor wire 26, and the impedance of the variable impedance unit 20 changes depending on at least one of the type of the element 21, the numbers of windings of the wound wires 11 and 12, the types of the wound wires 11 and 12, the type of the conductor wire 26, and the constant of the resistor 25. Thereby, the filter circuit 1 according to the first embodiment makes it possible to adjust the impedance of a cable as appropriate, and makes it possible to easily achieve both reduction of propagation of electromagnetic noise through the cable, and reduction of deterioration of signal transmission quality.

In addition, the element 21 is a junction field-effect transistor, the wound wires include the first wound wire 11, the first end 11*a* of the first wound wire 11 is connected to the drain terminal of the junction field-effect transistor, the second end 11*b* of the first wound wire 11 is connected to the source terminal of the junction field-effect transistor, and the impedance of the variable impedance unit 20 is equivalent to the ratio between the drain-source voltage of the junction field-effect transistor that is generated when the current or the voltage is induced from the conductor line to the first wound wire 11, and the drain-source current of the junction field-effect transistor that flows when the current or the voltage is induced from the conductor line to the first wound wire 11. Thereby, the filter circuit 1 according to the first embodiment makes it possible to achieve, with a simple configuration, both reduction of propagation of electromagnetic noise through a cable, and reduction of deterioration of signal transmission quality.

In addition, the wound wires includes the second wound wire 12, the first end 12*a* of the second wound wire 12 is connected to the gate terminal of the junction field-effect transistor, the second end 12*b* of the second wound wire 12 is connected to the source terminal of the junction field-effect transistor, and the impedance of the variable impedance unit 20 changes depending on the gate-source voltage of the junction field-effect transistor that is generated when the current or the voltage is induced from the conductor line to the second wound wire 12. Thereby, the filter circuit 1 according to the first embodiment makes it possible to adjust the impedance of a cable flexibly, and makes it possible to easily achieve both reduction of propagation of electromagnetic noise through the cable, and reduction of deterioration of signal transmission quality.

Note that, in the present disclosure, modification of any components in the embodiment or omission of any components in the embodiment is possible.

INDUSTRIAL APPLICABILITY

The present disclosure can achieve both reduction propagation of electromagnetic noise through a cable, and reduction of deterioration of signal transmission quality, and is suited to being used for a filter circuit.

REFERENCE SIGNS LIST

1: filter circuit; 10: magnetic material core; 11: first wound wire; 11*a*: end; 11*b*: end; 12: second wound wire; 12*a*: end; 12*b*: end; 20: variable impedance unit; 21: element (junction field-effect transistor); 22: peripheral circuit; 23: wound-wire connection terminal; 24: wound-wire connection terminal; 25: resistance; 26: conductor wire; 401 to 404: characteristics curve of drain current; 405: values of drain-source resistance

The invention claimed is:

1. A filter circuit comprising:
a magnetic material core having a hollow hole through which a conductor line is capable of being inserted;
a wound wire wound around the magnetic material core through the hollow hole of the magnetic material core; and
a variable impedance circuit that is connected with the wound wire, and has impedance that is variable depending on a current or a voltage induced from the conductor line to the wound wire, wherein
the variable impedance circuit includes:
an element having characteristics in which impedance of the element is variable adaptively depending on the current or the voltage induced from the conductor line to the wound wire;
a conductor wire that connects the element and both ends of the wound wire; and
a resistor connected to the conductor wire, and
the impedance of the variable impedance circuit changes depending on at least one of a type of the element, a number of windings of the wound wire, a type of the wound wire, a type of the conductor wire, and a constant of the resistor, and wherein
the element is a junction field-effect transistor,
the wound wire includes a first wound wire,
a first end of the first wound wire is connected to a drain terminal of the junction field-effect transistor,
a second end of the first wound wire is connected to a source terminal of the junction field-effect transistor, and
the impedance of the variable impedance circuit is equivalent to a ratio between a drain-source voltage of the junction field-effect transistor that is generated when a current or a voltage is induced from the conductor line to the first wound wire, and a drain-source current of the junction field-effect transistor that flows when the current or the voltage is induced from the conductor line to the first wound wire.

2. The filter circuit according to claim 1, wherein
the wound wire includes a second wound wire,
a first end of the second wound wire is connected to a gate terminal of the junction field-effect transistor,
a second end of the second wound wire is connected to the source terminal of the junction field-effect transistor, and
the impedance of the variable impedance circuit changes depending on a gate-source voltage of the junction field-effect transistor that is generated when a current or a voltage is induced from the conductor line to the second wound wire.

\* \* \* \* \*